(12) United States Patent
Kwon et al.

(10) Patent No.: US 8,053,799 B2
(45) Date of Patent: Nov. 8, 2011

(54) LED PACKAGE

(75) Inventors: You Jin Kwon, Ansan-si (KR); Jung Hu Seo, Ansan-si (KR); Byoung Ki Pyo, Ansan-si (KR); Kang Hyun Cho, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 157 days.

(21) Appl. No.: 12/443,293

(22) PCT Filed: Sep. 27, 2007

(86) PCT No.: PCT/KR2007/004727
§ 371 (c)(1),
(2), (4) Date: Mar. 27, 2009

(87) PCT Pub. No.: WO2008/039010
PCT Pub. Date: Apr. 3, 2008

(65) Prior Publication Data
US 2010/0072499 A1  Mar. 25, 2010

(30) Foreign Application Priority Data

Sep. 29, 2006 (KR) .......... 10-2006-0095653
Sep. 29, 2006 (KR) .......... 10-2006-0095656
Sep. 29, 2006 (KR) .......... 10-2006-0095657

(51) Int. Cl.
*H01L 33/00* (2010.01)
(52) U.S. Cl. .......... 257/98; 257/E33.056; 257/E33.061; 257/E33.067; 257/E33.075
(58) Field of Classification Search .......... None
See application file for complete search history.

(56) References Cited

U.S. PATENT DOCUMENTS

| 6,943,433 | B2 * | 9/2005 | Kamada ........................ 257/666 |
| 7,612,385 | B2 * | 11/2009 | Kim et al. ...................... 257/99 |
| 7,821,020 | B2 * | 10/2010 | Park ............................... 257/98 |
| 2002/0021085 | A1 * | 2/2002 | Ng ................................. 313/499 |
| 2002/0163006 | A1 | 11/2002 | Yoganandan et al. |
| 2004/0065894 | A1 * | 4/2004 | Hashimoto et al. .......... 257/100 |
| 2004/0256706 | A1 * | 12/2004 | Nakashima ................... 257/678 |
| 2006/0103012 | A1 * | 5/2006 | Chin ............................. 257/712 |
| 2006/0157686 | A1 * | 7/2006 | Jang et al. ...................... 257/14 |

FOREIGN PATENT DOCUMENTS

| JP | 2006-093626 | 4/2006 |
| JP | 2006-135276 | 5/2006 |
| KR | 10-2004-0093384 | 11/2004 |
| KR | 592508 B1 * | 6/2006 |

* cited by examiner

*Primary Examiner* — N Drew Richards
*Assistant Examiner* — Robert Carpenter
(74) *Attorney, Agent, or Firm* — H.C. Park & Associates, PLC (57) ABSTRACT

The present invention has an object to provide a LED package having a means capable of precisely limiting a region in which a resin containing a phosphor is dotted on a member on which an LED chip is supported. To this end, an LED package according to the present invention comprises a package body having an inner space with an LED chip mounted therein, the inner space being open toward a light emission direction; a chip support member mounted to the inner space of the package body to support the LED chip; a phosphor resin member formed by dotting resin containing a phosphor onto the LED chip; and a region limitation means provided on the chip support member and defining a region in which the phosphor resin member is formed.

7 Claims, 10 Drawing Sheets

Figure 14

LED PACKAGE

CROSS REFERENCE TO RELATED APPLICATIONS

This application is the National Stage of International Application No. PCT/KR2007/004727, filed Sep. 27, 2007, and claims priority from and the benefit of Korean Patent Application No. 10-2006-0095653, filed on Sep. 29, 2006, Korean Patent Application No. 10-2006-0095656, filed on Sep. 29, 2006, and Korean Patent Application No. 10-2006-0095657, filed on Sep. 29, 2006, which are all hereby incorporated by reference for all purposes as if fully set forth herein.

BACKGROUND OF THE INVENTION

1. Field of the Invention

The present invention relates to a light emitting diode (LED) package, and more specifically, to a LED package having a fence of a phosphor resin member and a manufacturing method thereof.

2. Discussion of the Background

Generally, an LED package has a structure in which an LED chip for generating light by p-n junction is mounted on an inner space of a package body. The package body is open in a light emission direction of the LED chip through an open portion of the package body, and the light generated from the LED chip is emitted outwards through the open portion. Further, the LED package includes a lens (specifically, a molding lens) for covering the LED chip in order to increase the light emission efficiency within a predetermined directional angle range of the light. The lens is formed to cover the open portion of the package body and to be convex from the open portion of the package body.

In case of the LED package, there has been a light loss problem that a substantial amount of the light generated from the LED chip is not emitted outwards through the lens but dissipated within the lens. Such a light loss results from the existence of the light which is not directed toward the lens covering the open portion but toward a side and/or a bottom of the package body and the light which collides with the lens and then is not emitted outwards but returns back.

Accordingly, many studies have been conventionally continued to increase the amount of the light directed toward the lens. As the results of the studies, a conventional technology in which an inner wall of a package body is slanted and the slanted inner wall is coated with a reflective material has been disclosed. Such a technology has been disclosed in Korean Patent No. 613064 filed by the applicant and then registered. According to the conventional technology, the inner wall coated with the reflective material causes the light, which is not directed toward the lens or which collides with the lens and then returns back, to be reflected, thereby contributing to reducing the light loss of the LED package more or less.

However, since the LED chip and the reflective inner wall are far away from each other and both ends of the open portion of the package body and the reflective inner wall are adjacent with each other, there is an enormous amount of light which is not under the influence of the reflective inner wall. Furthermore, in order to improve the light emission efficiency using the reflective inner wall in the conventional LED package, the reflective inner wall must be designed in an expanding manner, which may prevent a compact size and structure of the LED package.

Meanwhile, an LED package which includes a molding lens made of resin containing a powder-type phosphor material has been disclosed. When the light generated from the LED chip is emitted outwards through the molding lens, the intrinsic color of the light itself generated from the LED chip is mixed with the color generated from the phosphor material, so that the LED package makes it possible to implement the light having an adjusted light emission color (for example, white color). However, since the phosphor material is non-uniformly distributed in a broad region of the molding lens of such an LED package, it is difficult to realize homogeneous color mixing. Furthermore, there is a problem in that the phosphor material non-uniformly distributed in the molding lens may cause the light of the LED chip to be scattered.

To solve this problem, a LED package technology, in which besides the molding lens, a phosphor resin member for encapsulating the LED chip is provided in the molding lens, has been conventionally proposed. However, according to the conventional manufacturing of the LED package, it is difficult to allow the phosphor resin member to be formed in the shape of a homogeneous lens having excellent light emission efficiency. That is, when liquefied resin containing a powder-type phosphor material is dotted on the LED chip to form the phosphor resin member, it is difficult to obtain the curved surface shaped like a homogeneous lens due to the flowability of the liquefied resin. In addition, when an enormous amount of LED packages is manufactured, there is a limitation in that the homogeneous lens-shaped phosphor resin member having no chromatic aberration is repeatedly reproduced.

SUMMARY OF THE INVENTION

An object of the present invention is to provide a LED package having a means capable of precisely limiting a region in which a resin containing a phosphor is dotted on a member on which an LED chip is supported.

Another object of the present invention is to provide a LED package having a dish-shaped reflector capable of precisely limiting a dotting region of a resin containing a phosphor and reflecting light of an LED chip outwards in a periphery of the dotting region with the light loss reduced.

A further object of the present invention is to provide a LED package, in which a dotting region of a resin containing a phosphor is precisely limited around an LED chip and a portion on which the LED chip is positioned functions as a heat sink, thereby improving the heat radiation efficiency.

According to an aspect of the present invention, there is provided an LED package comprising a package body having an inner space with an LED chip mounted therein, the inner space being open through an open portion toward a light emission direction; a chip support member mounted to the inner space of the package body to support the LED chip; a phosphor resin member formed by dotting resin containing a phosphor onto the LED chip; and a region limitation means provided on the chip support member and defining a region in which the phosphor resin member is formed.

Preferably, the region limitation means is a dish-shaped reflector including a bottom with an opening for defining the region in which the phosphor resin member is formed, the dish-shaped reflector including a slanting side reflection portion. More preferably, the dish-shaped reflector further includes a protrusion rib protruding upwards around the opening to increase a height by which the phosphor resin member is formed.

Preferably, the region limitation means is a protrusion stage integrally formed on an upper surface of the chip support member, the resin containing the phosphor being dotted on the protrusion stage. More preferably, the LED package further comprises a dish-shaped reflector having a slantingly side reflection portion for reflecting light emitted from the LED chip, wherein a bottom of the dish-shaped reflector is formed with an opening fitted around the protrusion stage.

Preferably, the chip support member is a heat sink to be mounted to perform heat radiation of the LED chip.

Preferably, the LED package comprises a dish-shaped reflector coupled with at least a portion of the region limitation means, the dish-shaped reflector including a slanting side reflection portion, wherein the side reflection portion is configured to entirely cover the open portion of the package body.

Preferably, the LED package comprises a dish-shaped reflector coupled with at least a portion of the region limitation means, the dish-shaped reflector including a slanting side reflection portion, and a molding lens convexly formed on the open portion of the package body to cover the dish-shaped reflector.

Preferably, the LED package comprises a dish-shaped reflector coupled with at least a portion of the region limitation means, the dish-shaped reflector including a slanting side reflection portion, wherein the slant side reflection portion is formed with at least one wire groove for allowing a bonding wire connected from the LED chip to pass therethrough.

Preferably, the chip support member may a heat sink having an upper surface with a cavity, which is formed with a groove along an edge of a bottom thereof, and the region limitation means may be a protrusion stage formed to be partitioned inside of the groove, the LED chip being attached to the protrusion stage and then the resin containing the phosphor being dotted thereon. At this time, the cavity may include an inner wall having a slanting reflection surface, the slanting reflection surface having an inner diameter decreasing as it goes from an upper portion to a lower portion thereof. In addition, the groove is ring-shaped and the protrusion stage protrudes in cylindrical shape at a center of the ring-shaped groove.

According to one aspect of the present invention, liquefied resin containing a phosphor is formed in a relatively good shape onto a desired region of a chip support member, so that the phosphor may be uniformly distributed around the LED chip.

According to another aspect of the present invention, the dish-shaped reflector, which is positioned together with the LED chip on the chip support member and the phosphor resin member for covering the LED chip, makes it possible to dramatically reduce the light loss.

DETAILED DESCRIPTION OF THE ILLUSTRATED EMBODIMENTS

Hereinafter, embodiments according to the present invention will be described in detail with reference to the accompanying drawings. Through the descriptions of the embodiments, an LED package including a heat sink used as a chip support member for supporting a LED chip and used for radiating heat generated from the LED chip will be illustrated as an example. However, the present invention is not limited to the LED package including the heat sink as will be illustrated hereinafter, but may be limited by only the matters described in the claims.

Embodiment 1

Figure 1:
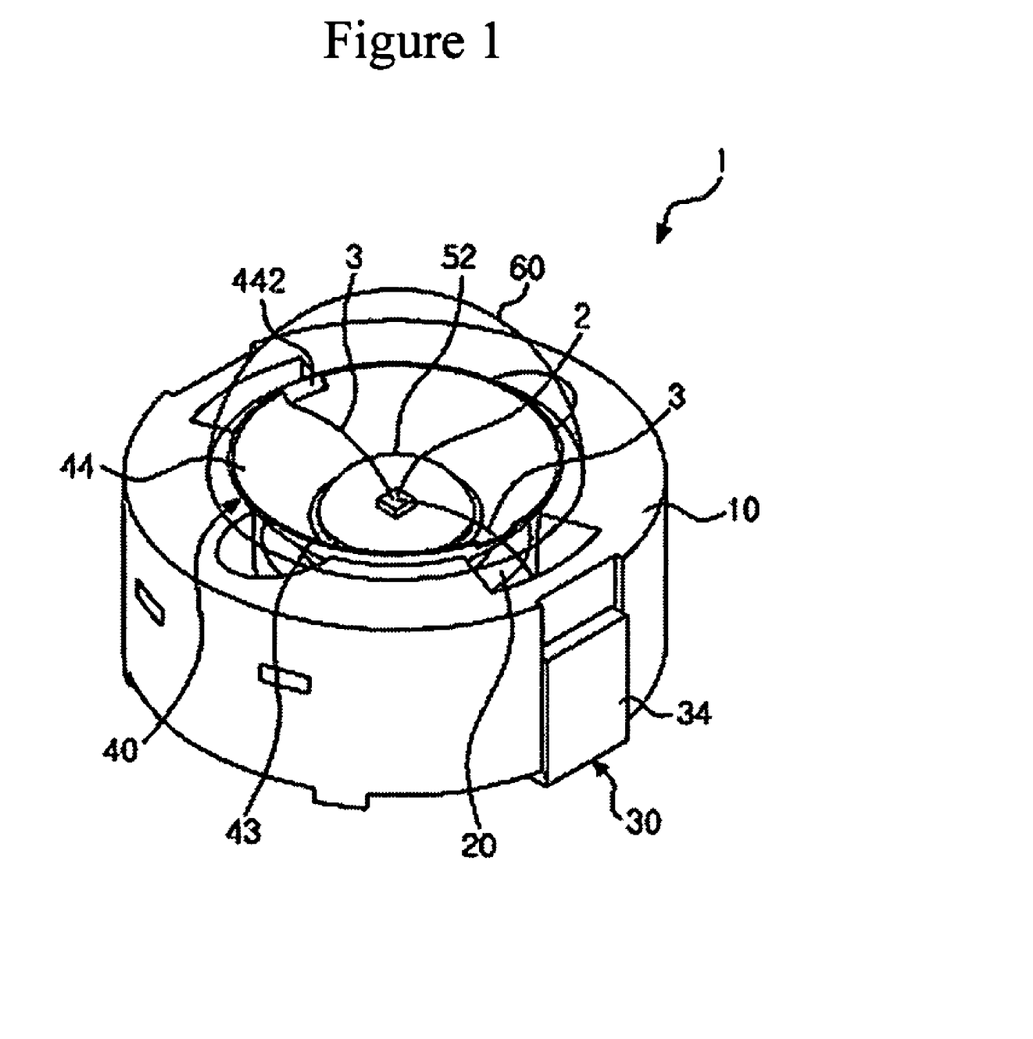
FIG. 1 is a perspective view showing an LED package according to an embodiment of the present invention.
Figure 2:
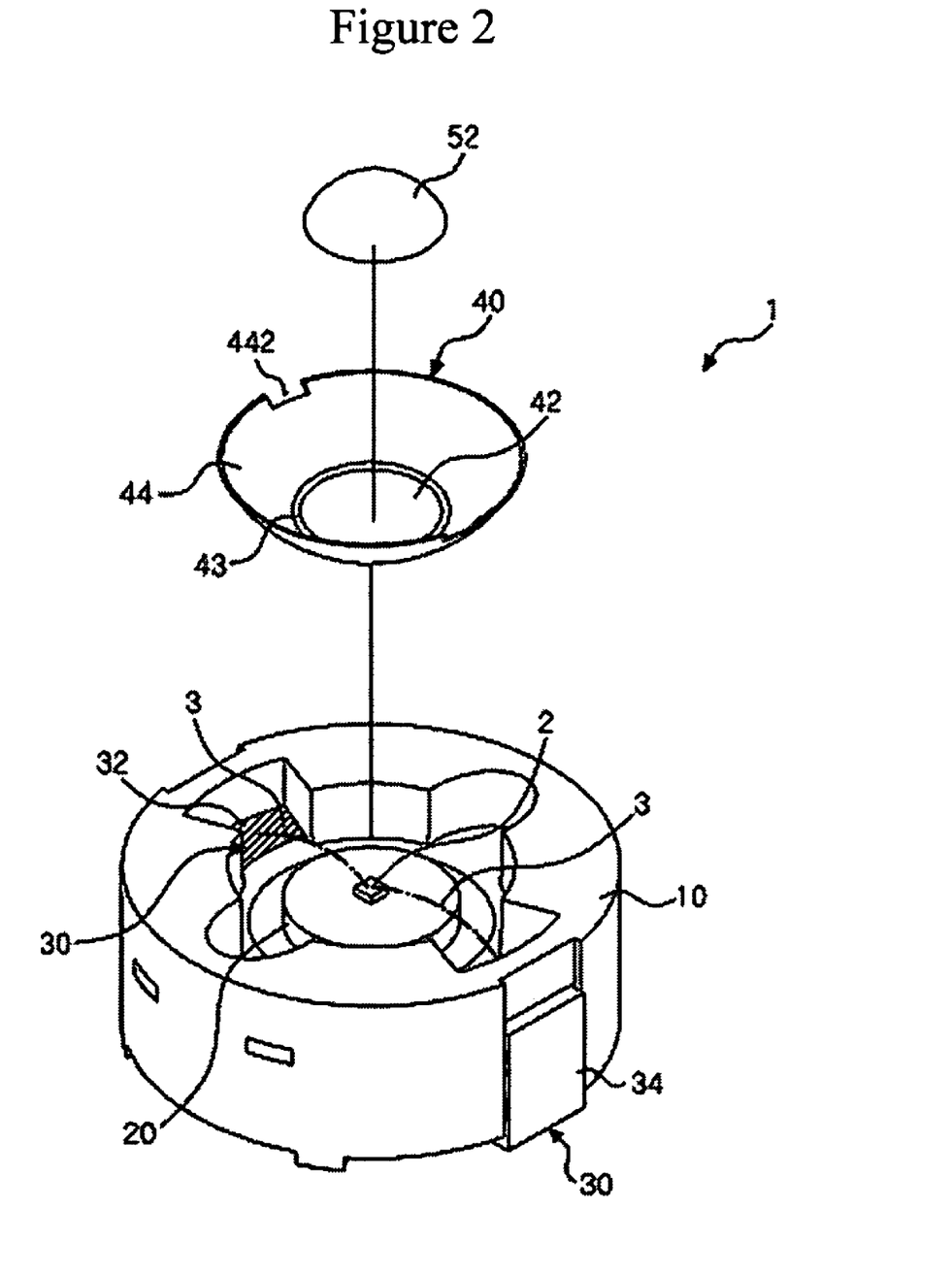
FIG. 2 is an exploded perspective view showing the LED package according to the embodiment of the present invention with a molding lens removed.
Figure 3:
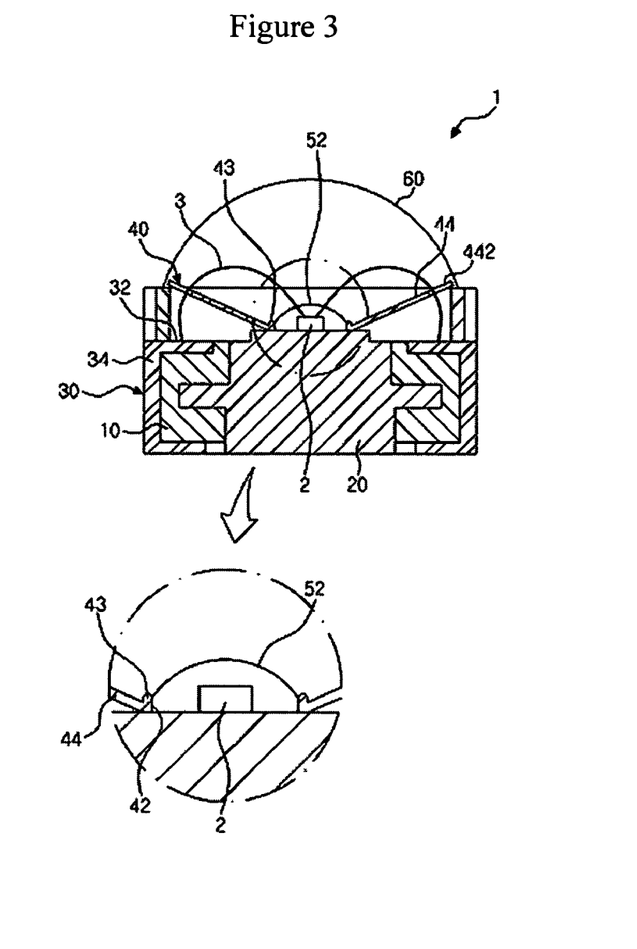
FIG. 3 is a sectional view showing the LED package according to the embodiment of the present invention.

FIG. 1 is a perspective view generally showing an LED package according to an embodiment of the present invention, FIG. 2 is a partially exploded perspective view showing the LED package according to the embodiment of the present invention with a molding lens removed, and FIG. 3 is a sectional view showing the LED package shown in FIG. 1.

Referring to FIGS. 1 to 3, an LED package 1 according to the present invention includes a package body 10 having an inner space, in which an LED chip 2 is mounted and which is open upwards in a light emission direction. The package body 10 may be formed by molding and sintering ceramic or by injection molding plastic resin. A heat sink 20, which is conventionally called a heat transfer 'slug', is mounted to be inserted into the inner space of the package body 10. At this time, the heat sink may be replaced with a heat pipe structure.

Further, a lead frame 30 is mounted to the package body 10. Inner leads 32 (shown in FIGS. 2 and 3) of the lead frame 30 are positioned around the heat sink 20 within the package body 10 while outer leads 34 of the lead frame 30 are connected to the inner leads 32 and extend outside of the package body 10.

Since a lower portion of the heat sink 20 is exposed outwards through an opening of a bottom of the package body 10, the heat of the LED chip 2 can be easily radiated outwards. Further, a bottom of the package body 10 is closed by the lower portion of the heat sink 20 while an upper end of the package body 10 is open to provide the light emission and to form the molding lens. The LED chip 2 is attached to and supported by a flat surface of an upper end of the heat sink 20.

Further, the LED chip 2 is electrically connected to the inner leads 32 of the lead frame 30 through bonding wires 3. The bonding wires 3 are respectively bonded and connected to opposite polarity electrodes of the LED chip 2, and connected to the inner leads 32 of the lead frame 30 after passing through wire grooves 442 of a dish-shaped reflector 40 which will be described later. At this time, the wire grooves 442 may be omitted depending on the positions of the inner leads 32.

Further, the LED chip 2 is encapsulated by a lens-shaped phosphor resin member 52 which is separately formed inside a molding lens 60. The phosphor resin member 52 is formed by dotting liquefied resin (hereinafter, liquefied phosphor resin) containing a powder-type phosphor material around the LED chip 2 and then curing it. At this time, it is preferable that the phosphor resin member 52 cause the LED chip 2 to be fixed so that the LED chip 2 is fixed without an additional adhesive.

The LED package 1 includes a portion having a fence shape, which is to limit a region in which the phosphor resin member 52 is formed, around the LED chip 2. In this embodiment, the dish-shaped reflector 40 which can reflect the light emitted from the LED chip 2 toward the molding lens 60 without any loss is used as the portion for limiting the region.

As well shown in FIGS. 2 and 3, the dish-shaped reflector 40 is integrally provided with a circular protrusion rib 43 along a circular opening 42 which is formed in a bottom of the dish-shaped reflector 40. Accordingly, when the dish-shaped reflector 40 is arranged to surround the LED chip 2 on the heat sink 20, the dish-shaped reflector 40 allows a fence for limiting the periphery of the LED chip 2 to be formed within the circular opening 42. At this time, the height of the fence is determined by the thickness of a lower portion of the dish-shaped reflector 40 and the height of the circular protrusion rib 43. Accordingly, as the height of the circular protrusion rib 43 is designed to be large, the height of the fence defined by the dish-shaped reflector 40 may be large.

Liquefied epoxy or silicon resin containing a powder-type phosphor is dotted within the fence, so that the phosphor resin member 52 shaped in a convex lens as shown in FIGS. 1 to 3 is formed with a homogeneous curved surface. The shape of the phosphor resin member 52 may be achieved using a liquid-drop phenomenon due to the surface tension, i.e., a phenomenon in which a surface area is minimized to have a shape for minimizing a surface area per unit volume. Since the phosphor resin member 52 is formed using the liquid-drop phenomenon within the fence having a predetermined height, the phosphor resin member 52 may be formed to have a homogeneous curved surface whose reproducibility is excellent.

The dish-shaped reflector 40 further includes a side reflection portion 44 which slantingly expands from the lower portion thereof. The dish-shaped reflector 40 may be formed of a metal material with excellent reflectivity, or a non-metal material such as a resin with the whole surface coated with metal or with only the side reflection portion 44, in which the light reflection mostly occurs, coated with metal. At this time, since the dish-shaped reflector 40 has a dish-shaped structure in which the side reflection portion 44 of the dish-shaped reflector 40 expands upward to the open portion of the package body 10, the dish-shaped reflector 40 may cover the entire open portion of the package body 10. This prevents the light, which is generated from the LED chip 2 and then color-mixed after passing through the phosphor resin member 52, from reaching an inner wall of the package body in which a light loss may be largely generated.

The side reflection portion 44 makes it possible to reflect and direct the light, which fails to be directed to the molding lens 60 (shown in FIGS. 1 and 3) but is directed to a side and/or a bottom of the package body 10, among the light generated from the LED chip 2, toward the upper open portion of the package body 10 or the molding lens 60. Further, the side reflection portion 44 has a dish-type curved surface which is equi-distant from the LED chip 2 in the radius direction, thereby having a structure which allows homogeneous light reflection.

As described above, two wire grooves 442 for allowing the two bonding wires 3 to pass therethrough are provided on an upper end of the side reflection portion 44 of the dish-shaped reflector 40. Accordingly, the bonding wires 3 connected to the LED chip 2 can be connected to the inner leads 32 of the lead frame 30 without passing through a longer path even if there is the dish-shaped reflector 40. At this time, the wire groove 442 may be formed in the shape of a hole that is formed in a middle portion of the side reflection portion 44 not the upper end thereof.

As described above, the molding lens 60 is formed on the upper open portion of the package body 10 to have a structure which is convex in the light emission direction in a semi-sphere shape. Although not shown, the molding lens 60 is formed by a mold molding technology, in which a mold having a resin injection opening is temporarily installed onto the upper portion of the package body 10 and then liquefied resin such as transparent epoxy or silicon resin is injected through the injection opening of the mold. At this time, the mold has an inner shape or a void corresponding to the molding lens 60.

Some of the light generated from the LED chip 2 may be not transmitted through the molding lens 60 due to the total internal reflection to return toward the bottom of the LED chip 2. At this time, the light loss caused by the some of the light which is not transmitted through the molding lens 60 can be minimized using the dish-shaped reflector 40.

Figure 4:
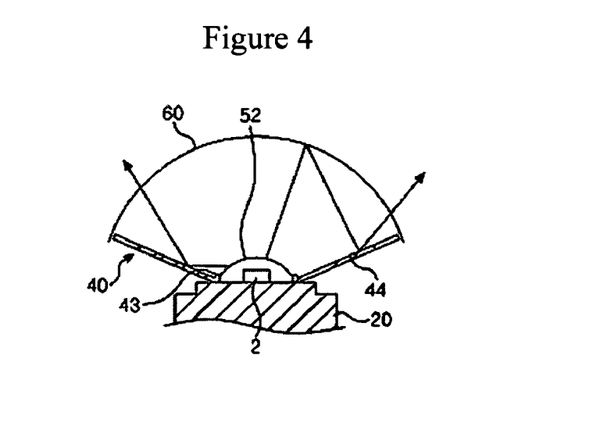
FIG. 4 is a view illustrating reflection operation of the LED package according to the embodiment of the present invention.

FIG. 4 is a view illustrating the reflection operation of the dish-shaped reflector 40. The operation, in which the dish-shaped reflector 40 allows some of the light, which is directly emitted from the LED chip 2, and some of the light, which is not transmitted through the molding lens 60 and returns to the dish-shaped reflector 40, to be reflected toward the molding lens 60, is represented by arrows in FIG. 4. The dish-shaped reflector 40 allows the light, which collides with the molding lens 60 and returns to the dish-shaped reflector 40, to be reflected at another angle, so that the light can be directed to the molding lens 60 again, thereby largely contributing to preventing the light loss due to the light colliding with the molding lens 60.

Hereinafter, a manufacturing process of the LED package 1 according to the embodiment of the present invention will be described with reference to FIG. 5. Since in the below description, a process for mounting the heat sink 20 and the lead frame 30 to the package body 10 conforms to a conventional manner, the illustration and details thereon will be omitted from the drawing and the specification.

Figure 5:
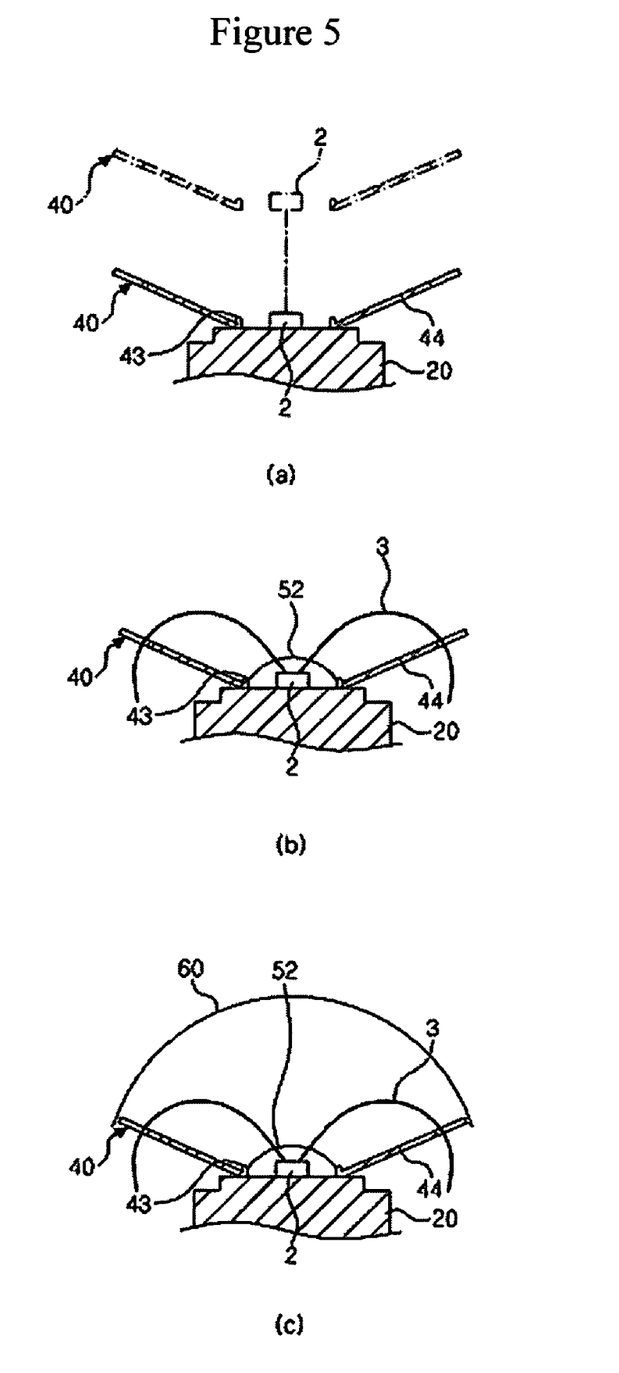
FIG. 5 is a view illustrating a manufacturing process of the LED package according to the embodiment of the present invention.

As shown in FIG. 5(a), the LED chip 2 is bonded to the upper surface of the heat sink 20 which forms a support member for the LED chip 2, and then the dish-shaped reflector 40 is arranged on the heat sink 20. Then, the LED chip 2 and the lead frame 30 are electrically connected to each other through the bonding wires 3. When the dish-shaped reflector 40 is arranged on the heat sink 20 to surround the LED chip 2, the single circular fence is formed around the LED chip 2 along the circular protrusion rib 43 of the dish-shaped reflector 40.

Then, as shown in FIG. 5(b), the phosphor resin member 52 is formed in the circular fence which is defined by the circular protrusion rib 43. At this time, the phosphor resin member 52 is formed by dotting the liquefied epoxy or silicon resin containing a phosphor material within the fence and then curing it. Thereafter, the phosphor resin member 52 is formed to have a homogeneous curved surface, which is shaped like a convex lens having excellent light emission efficiency, using the liquid-drop phenomenon due to the surface tension of the liquefied resin.

Thereafter, while the LED chip 2 encapsulated by the phosphor resin member 52 is surrounded by the dish-shaped reflector 40, as shown in FIG. 5(c), the molding lens 60 is formed to cover all the LED chip 2, the phosphor resin member 52, the heat sink 20 and the dish-shaped reflector 40.

It has been described in the previous embodiments that the LED chip 2 is supported on the heat sink 20, and the dish-shaped reflector 40 is arranged on the heat sink 20 to surround the LED chip 2. However, when the LED chip 2 is not supported by the heat sink 20 but another lead frame, lead electrode, or the like, the dish-shaped reflector 40 may be arranged on the other lead frame or lead electrode to surround the LED chip 2.

Further, although it has been described that the circular fence provided for the convex lens shaped phosphor resin member 52 is defined by the circular protrusion rib 43 of the dish-shaped reflector 40, the region in which the phosphor resin member 52 is formed may be defined by a protrusion having no reflection operation.

Embodiment 2

Hereinafter, an LED package according to another embodiment of the present invention will be described with reference to FIGS. 6 to 10. Like reference numerals will be assigned to represent the constitutional elements which perform the same functions as described above.

Referring to FIGS. 6 to 9, an LED package 1 of this embodiment includes the heat sink 20 as a chip support member, and the dish-shaped reflector 40.

Figure 6:
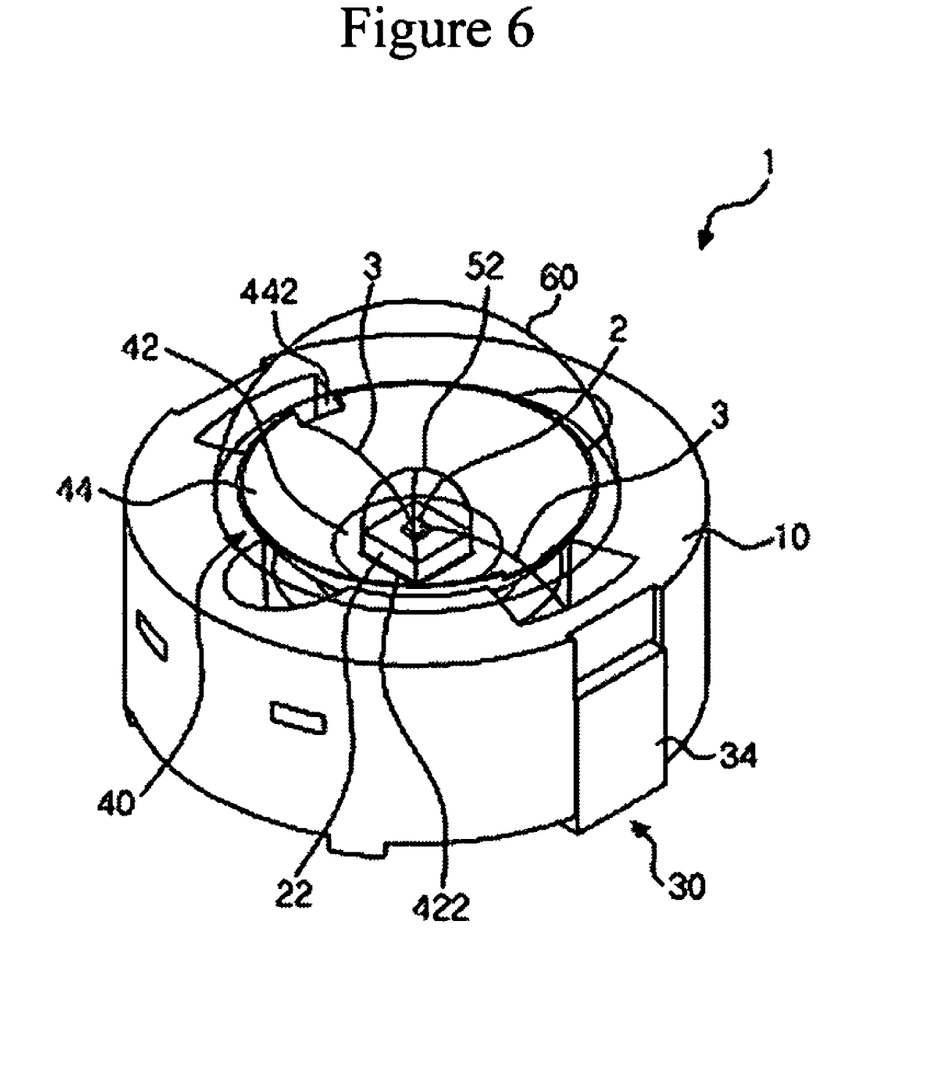
FIG. 6 is a perspective view showing an LED package according to another embodiment of the present invention.
Figure 7:
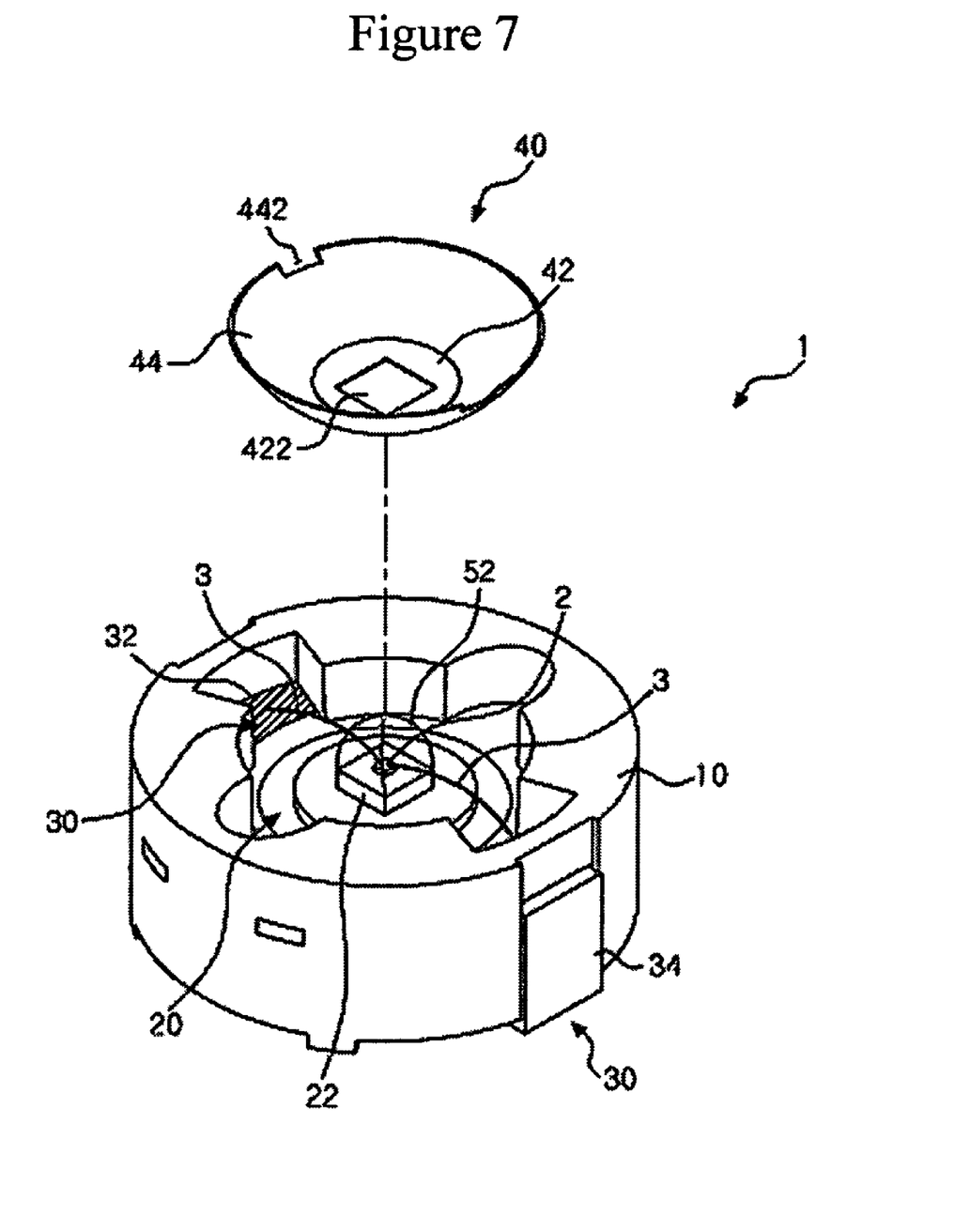
FIG. 7 is an exploded perspective view showing the LED package shown in FIG. 6 with a molding lens removed.
Figure 8:
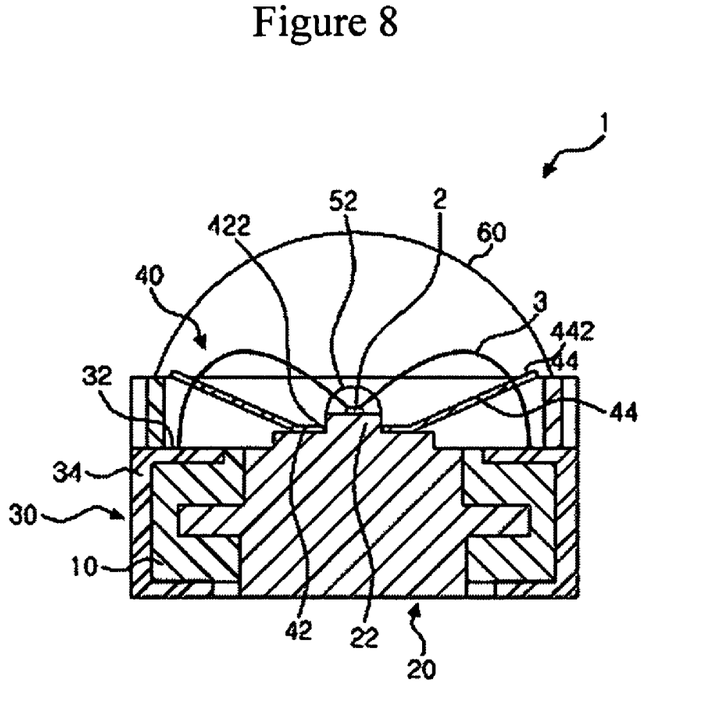
FIG. 8 is a sectional view showing the LED package shown in FIGS. 6 and 7.

A protrusion stage 22 having a substantial quadrangular cross section is provided on an upper end of the heat sink 20, and the LED chip 2 is attached and supported to the end surface of the protrusion stage 22. The LED chip 2 is encapsulated by the phosphor resin member 52 formed on and defined by the end surface of the protrusion stage 22. The phosphor resin member 52 is formed by curing liquefied resin (hereinafter, liquefied phosphor resin) containing a powder-type phosphor material, which is dotted on the end surface of the protrusion stage 22. At this time, the liquefied phosphor resin may be formed to be defined on only the end surface of the protrusion stage 22 due to the surface tension, so that, in this embodiment, the protrusion stage 22 functions as a means for defining a region in which a phosphor resin member is dotted.

The phosphor material of the phosphor resin member 52 may be various kinds of phosphor materials for color-mixing with the light generated from the LED chip 2 to implement white light. Since the phosphor resin member 52 is formed separately from the molding lens 60 (see FIG. 1), it is possible to solve various conventional problems which have resulted from the phosphor materials being irregularly distributed in a relatively broad molding lens.

Meanwhile, the LED chip 2 is electrically connected to the inner leads 32 of the lead frame 30 by means of the bonding wires 3. The respective bonding wires 3 are bonded and connected to opposite polarity electrodes of the LED chip 2, and connected to the inner leads 32 of the lead frame 30 after passing through the wire grooves 442 of the dish-shaped reflector 40.

The LED package 1 according to this embodiment includes the dish-shaped reflector 40, which is arranged on the heat sink 20 which functions as a chip support member to reflect the light emitted from the LED chip 2 at a predetermined angle. The dish-shaped reflector 40 includes a flat bottom 42 and a side reflection portion 44 slantingly expanding from the flat bottom 42. The dish-shaped reflector 40 may be formed of a metal material with excellent reflectivity, or a non-metal material such as a resin with the whole surface coated with metal or with only the side reflection portion 44, in which the light reflection mostly occurs, coated with metal. Specifically, the dish-shaped reflector 40 makes it possible to prevent the light from reaching the inner wall of the package body 10 in which a light loss may easily occur by covering the entire upper open portion of the package body 10.

An opening 422 which is fitted around the protrusion stage 22 of the heat sink 20 is formed in the bottom of the dish-shaped reflector 40. The protrusion stage 22 and the opening 422 are formed to have corresponding shapes to each other. In this embodiment, the protrusion stage 22 has a quadrangular cross section while the opening 422 is also formed in a quadrangular shape corresponding thereto. Accordingly, the opening 422 of the dish-shaped reflector 40 is fitted around the protrusion stage 22 of the heat sink 20, so that a rotational movement may be prevented.

Further, the LED chip 2 attached to and supported by the protrusion stage 22 and the phosphor resin member 52 encapsulating the LED chip 2 are positioned within the dish-shaped reflector 40 through the opening 422. Thus, the slanting side reflection portion 44 of the dish-shaped reflector 40 makes it possible to reflect and direct the light, which fails to be directed to the molding lens 60 that will be described later (shown in FIGS. 6 and 8) but is directed to a side and/or a bottom of the package body 10, among the light generated from the LED chip 2, toward the upper open portion of the package body 10 or the molding lens 60. Furthermore, the side reflection portion 44 has a substantially cone-shaped curved surface with the LED chip 2 as a center, so that the regular and homogeneous light reflection characteristic can be realized in a circumferential direction.

As described above, two wire grooves 442 for allowing the two bonding wires 3 to pass therethrough are provided on an upper end of the side reflection portion 44 of the dish-shaped reflector 40. Accordingly, the bonding wires 3 connected to the LED chip 2 can be connected to the inner leads 32 of the lead frame 30 without passing through a longer path even if there is the dish-shaped reflector 40. At this time, the wire groove 442 may be formed in the shape of a hole that is formed in a middle portion of the side reflection portion 44 not the upper end thereof.

As well shown in FIGS. 6 and 8, the molding lens 60 is formed on the upper open portion of the package body 10 to have a structure which is convex in the light emission direction in a semi-sphere shape. Although not shown, the molding lens 60 is formed by a mold molding technology, in which a mold having a resin injection opening is temporarily installed onto the upper portion of the package body 10 and then liquefied resin such as transparent epoxy or silicon resin is injected through the injection opening of the mold. At this time, the mold has an inner shape or a void shape corresponding to the molding lens 60.

Some of the light generated from the LED chip 2 may be not transmitted through the molding lens 60 due to the total internal reflection to return toward the bottom of the LED chip 2. At this time, the light loss caused by the some of the light which is not transmitted through the molding lens 60 can be minimized using the dish-shaped reflector 40.

Figure 9:
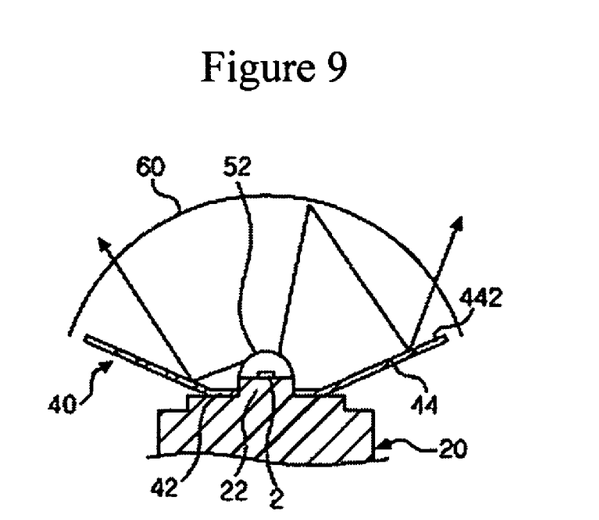
FIG. 9 is a view illustrating reflection operation of the LED package shown in FIGS. 6 to 8.

FIG. 9 is a view illustrating the operation of the dish-shaped reflector 40. The operation, in which the dish-shaped reflector 40 allows some of the light, which is directly emitted from the LED chip 2, and some of the light, which is not transmitted through the molding lens 60 and returns to the dish-shaped reflector 40, to be reflected toward the molding lens 60, is represented by arrows in FIG. 9. The dish-shaped reflector 40 allows the light, which collides with the molding lens 60 and returns to the dish-shaped reflector 40, to be reflected at a angle different from an original one, so that the light can be directed to the molding lens 60 again, thereby largely contributing to preventing the light loss due to the light colliding with the molding lens 60.

Hereinafter, a manufacturing process of the LED package 1 according to the embodiment of the present invention will be described with reference to FIG. 10. Since in the below description, a process for mounting the heat sink 20 and the lead frame 30 to the package body 10 conforms to a conventional manner, the illustration and details thereon will be omitted from the drawing and the specification.

Figure 10:
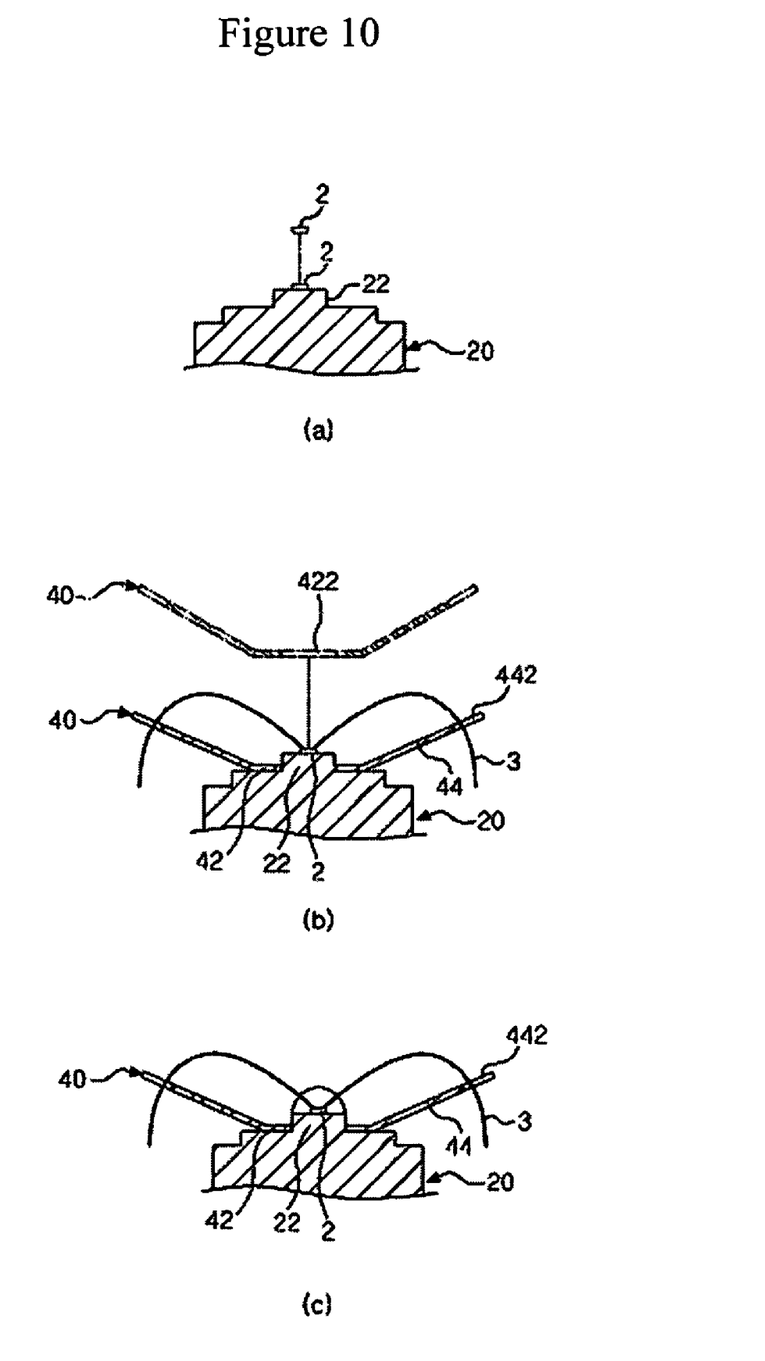
FIG. 10 is a view illustrating a manufacturing process of the LED package shown in FIGS. 6 to 9.

As shown in FIG. 10(a), the LED chip 2 is bonded to the protrusion stage 22 of the upper end of the heat sink 20 which forms a support member for the LED chip 2, and as shown in FIG. 10(b), the dish-shaped reflector 40 is arranged on the heat sink 20. At this time, the flat bottom 42 of the dish-shaped reflector 40 is rested on the flat surface of the heat sink 20, and the rectangular opening 422 formed in the bottom of the dish-shaped reflector 40 is fitted around the protrusion stage 22 of the heat sink 20 having a quadrangular cross section corresponding thereto. Accordingly, the dish-shaped reflector 40 can be maintained to be fixed to the desired position on the heat sink 20. The processes shown in FIG. 10(a) and FIG. 10(b) may be performed in the reverse sequence.

Then, the respective electrodes of the LED chip 2 and the lead frame are connected to each other through the bonding wires 3. The liquefied epoxy or silicon resin containing a phosphor material, i.e., the liquefied phosphor resin, is dotted onto the protrusion stage 22 of the heat sink 20 to which the LED chip 2 is attached. Since the liquefied phosphor dotted onto the protrusion stage 22 is formed to be defined onto the end surface of the protrusion stage 22 due to the surface tension, so that the phosphor resin member 52 as shown in FIG. 10(c) may be formed.

As shown in FIG. 10(c), in a state where the LED chip 2 encapsulated by the phosphor resin member 52 is surrounded by the dish-shaped reflector 40, the molding lens 60 as shown in FIGS. 6 and 8 is formed around the upper open portion of the package body 10 to encapsulate each of the LED chip 2, the phosphor resin member 52 and the dish-shaped reflector 40.

It has been described in the previous embodiments that the LED chip 2 is supported on the heat sink 20, and the dish-shaped reflector 40 is arranged on the heat sink 20 to surround the LED chip 2. However, when the LED chip 2 is not supported by the heat sink 20 but another lead frame, lead electrode, or the like, the dish-shaped reflector 40 may be arranged on the other lead frame or lead electrode to surround the LED chip 2.

Embodiment 3

Hereinafter, an LED package according to another embodiment of the present invention will be described with reference to FIGS. 11 to 14. Like reference numerals will be assigned to represent the constitutional elements which perform the same functions as described above.

Referring to FIGS. 11 to 14, the LED package of this embodiment includes the heat sink 20 and a cavity 23, wherein the heat sink 20 is installed to the package body 10 and the cavity 23 is formed on an upper portion of the heat sink 20.

Figure 11:
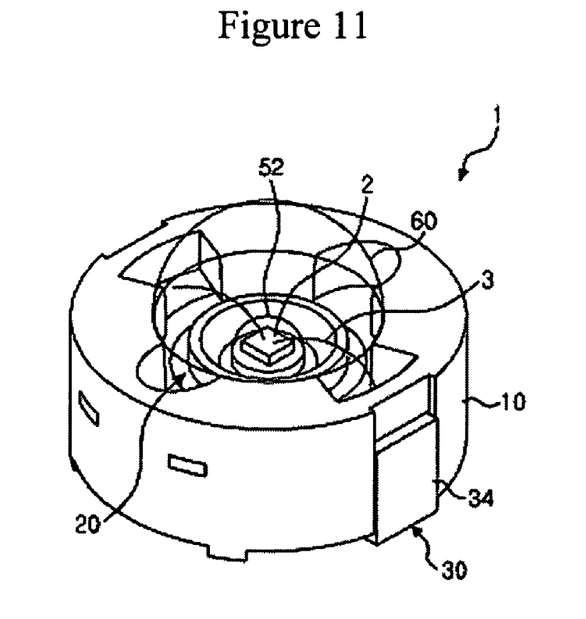
FIG. 11 is a perspective view showing an LED package according to a further embodiment of the present invention.
Figure 13:
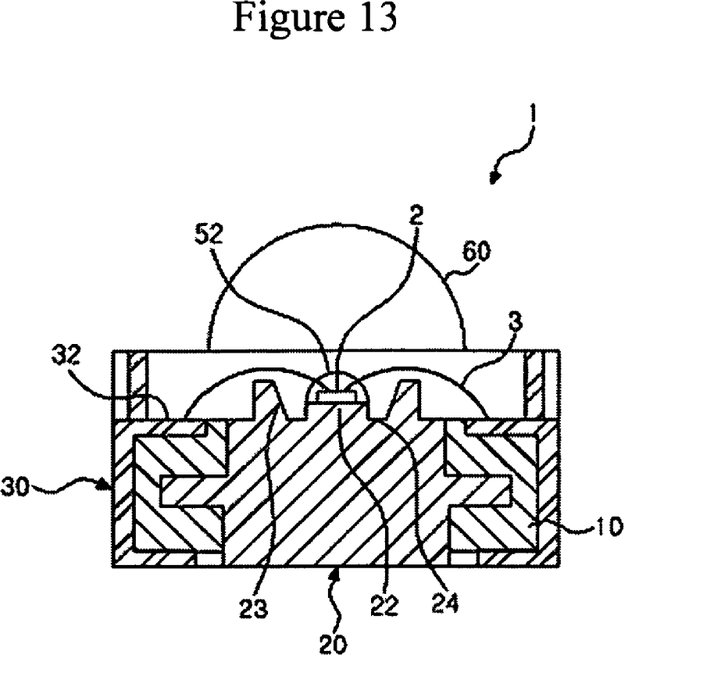
FIG. 13 is a sectional view showing the LED package shown in FIGS. 11 and 12.
Figure 14:
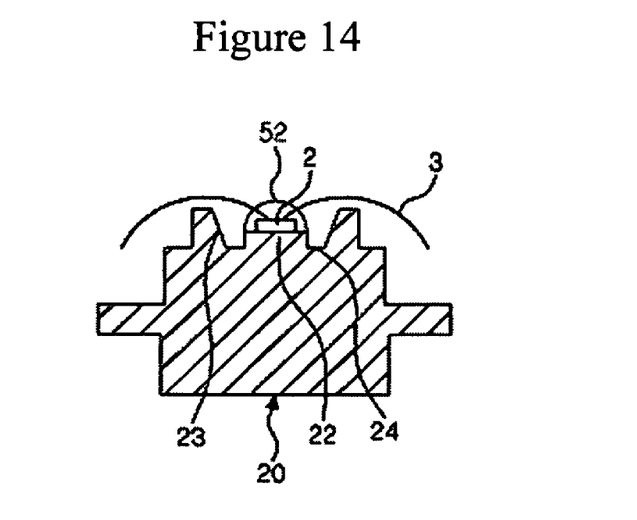
FIG. 14 is a sectional view showing a heat sink shown in FIG. 11.

A bottom of the package body 10 is configured to be closed by a lower portion of the heat sink 20 while an upper portion of the package body 10 is open for providing the light emission and forming the molding lens 60. The upper portion of the heat sink 20 is formed with the cup shaped cavity 23, and a groove 24 is formed on an edge of an inside bottom of the cavity 23. The groove 24 on the bottom of the cavity 23 is generally formed in a ring shape. However, the groove is not limited thereto, but may be formed in various shapes depending on the package body 10 of the LED chip 2. Further, although it is shown in the figures that the bottom surface of the groove 24 is flat, the bottom surface may be formed to have various shapes such as a V-shaped valley.

In addition, a protrusion stage 22 is formed in the groove 24 of the bottom surface of the cavity, and the protrusion stage 22 protrudes in cylindrical shape at a center of the ring-shaped groove 24. The LED chip 2 is attached to and supported by the upper surface of the protrusion stage 22. The LED chip 2 is attached to the protrusion stage 22 and then the phosphor resin member 52 is formed thereon. The LED chip 2 is encapsulated by the phosphor resin member 52 formed on the upper surface of the protrusion stage 22. The phosphor resin member 52 is formed by dotting the liquefied resin (hereinafter, liquefied phosphor resin) containing a phosphor material onto the upper surface of the protrusion stage 22. At this time, the liquefied phosphor resin may be formed to be defined on the upper surface of the protrusion stage 22 due to the surface tension. The phosphor material of the phosphor resin member 52 may be various kinds of phosphor materials for color-mixing with the light generated from the LED chip 2 to implement white light.

In this case, since the phosphor resin member 52 is limitedly formed on the upper surface of the protrusion stage 22, the phosphor resin member 52 can be formed more compact while it has a convex cross section which is similar with that of a conventional phosphor resin member formed on a flat-type heat sink. Thus, the defect rate due to a phosphor resin member punctured in its manufacturing process can be reduced and the chromatic aberration phenomenon which has been problematic in the conventional cup-type heat sink can be prevented.

The cavity 23 formed in the heat sink 20 slantingly expands from the bottom surface of the cavity 23 so that an inner diameter of an inner wall of the cavity 23 is decreased as it goes from its upper portion to its lower portion in order to reflect the light emitted from the LED chip 2 attached to the protrusion stage 22 in a desired directional angle range. Further, it is preferable that the slanted inner wall of the cavity 23 be formed of a metal material with excellent reflectivity or a surface of the slanted inner wall be coated with metal to be formed as a reflective surface.

The LED chip 2 attached to and supported by the protrusion stage 22 and the phosphor resin member 52 encapsulating the LED chip 2 are positioned inside of the reflective surface of the cavity 23, so that the reflective surface makes it possible to reflect and transmit the light, which is not directed to the molding lens 60 but is directed to a side and/or a bottom of the package body 10, among the light generated from the LED chip 2, toward the upper open portion of the package body 10 or the molding lens 60. Furthermore, the reflective surface formed on the slanted inner wall of the cavity 23 has a substantially cone-shaped curved surface with the LED chip 2 as a center, so that the regular and homogeneous light reflection characteristic can be realized in a circumferential direction.

Figure 12:
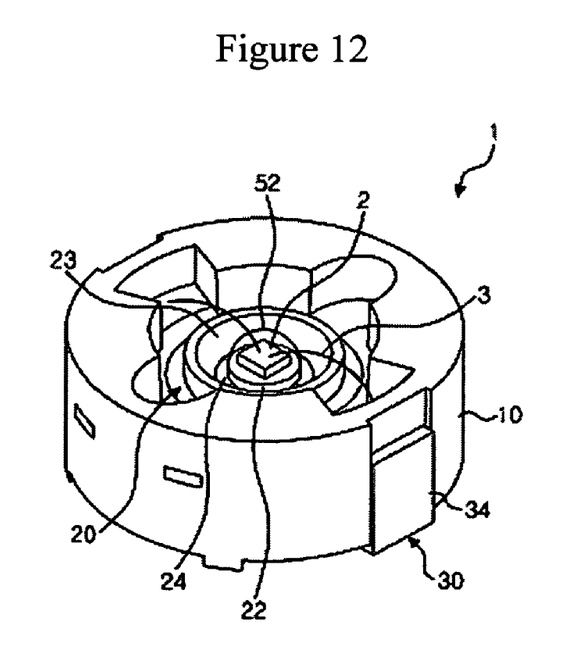
FIG. 12 is an exploded perspective view showing the LED package shown in FIG. 11 with a molding lens removed.

Meanwhile, the LED chip 2 is electrically connected to the inner leads 32 of the lead frame 30 through the bonding wires 3.

As shown in FIGS. 11 and 13, the molding lens 60 is formed on the upper open portion of the package body 10 to have a structure having various shapes convex in the light emission direction, e.g., a semi-sphere shape. Although not shown, the molding lens 60 may be formed by a mold molding technology, in which a mold having a resin injection opening is temporarily installed onto the upper portion of the package body 10 and then liquefied resin such as transparent epoxy or silicon resin is injected through the injection opening of the mold.

The invention claimed is:

1. An LED package, comprising:
   a package body having an inner space with an LED chip mounted therein, the inner space connected with an open portion in a light emission direction;
   a chip support member mounted to the inner space of the package body to support the LED chip;
   a phosphor resin member formed by dotting resin containing a phosphor onto the LED chip;
   a region limiter provided on the chip support member and defining a region in which the phosphor resin member is formed; and
   wherein the region limiter comprises a dish-shaped reflector comprising a bottom with an opening to define the region in which the phosphor resin member is formed, a slanted side reflection portion, and a protrusion rib protruding upwards around the opening to increase a height by which the phosphor resin member is formed,
   wherein the dish-shaped reflector contacts the phosphor resin member.

2. The LED package as claimed in claim 1, wherein the chip support member is a heat sink.

3. The LED package as claimed in claim 1, wherein the dish-shaped reflector comprises a slanted side reflection portion, wherein the side reflection portion is configured to entirely cover the open portion of the package body.

4. The LED package as claimed in claim 1, wherein the dish-shaped reflector comprises a slanted side reflection portion, and a molding lens convexly formed on the open portion of the package body to cover the dish-shaped reflector.

5. The LED package as claimed in claim 1, wherein the dish-shaped reflector comprises a slanting side reflection portion, and wherein the slanting side reflection portion comprises at least one wire groove for allowing a bonding wire connected to the LED chip to pass therethrough.

6. An LED package, comprising:
   a package body having an inner space with an LED chip mounted therein, the inner space connected with an open portion in a light emission direction;
   a chip support member mounted to the inner space of the package body to support the LED chip;
   a phosphor resin member formed by dotting resin containing a phosphor onto the LED chip; and
   a region limiter provided on the chip support member and defining a region in which the phosphor resin member is formed,
   wherein the chip support member is a heat sink having an upper surface with a cavity, the cavity being formed with a groove along an edge of a bottom thereof, and the region limiter is a protrusion stage formed to be partitioned inside of the groove, the LED chip being attached to the protrusion stage and then the resin containing the phosphor being dotted thereon,
   wherein the cavity includes an inner wall having a slanted reflection surface, the slanted reflection surface having an inner diameter decreasing as it goes from an upper portion to a lower portion thereof.

7. The LED package as claimed in claim 6, wherein the groove is a ring-shaped groove and the protrusion stage protrudes in a cylindrical shape at a center of the ring-shaped groove.

* * * * *